United States Patent [19]
Kurtz

[11] Patent Number: 5,815,088
[45] Date of Patent: Sep. 29, 1998

[54] RF SWITCHING WITH REMOTE CONTROLLERS DEDICATED TO OTHER DEVICES

[76] Inventor: Fred R. Kurtz, 5698 Westbourne Ave., Columbus, Ohio 43213

[21] Appl. No.: 748,132

[22] Filed: Nov. 12, 1996

Related U.S. Application Data

[62] Division of Ser. No. 488,999, Jun. 8, 1995, Pat. No. 5,574,440, which is a division of Ser. No. 174,224, Dec. 28, 1993, Pat. No. 5,491,472.

[51] Int. Cl.⁶ .............................. G08C 19/00; H04B 10/00
[52] U.S. Cl. ................................ 340/825.72; 340/825.22; 348/705; 359/146; 359/148
[58] Field of Search .................... 340/825.72, 825.69, 340/825.22; 359/146, 148, 142; 348/734, 705; 341/23

[56] References Cited

U.S. PATENT DOCUMENTS

| | | | |
|---|---|---|---|
| 3,098,212 | 7/1963 | Creamer | 340/825.69 |
| 4,663,626 | 5/1987 | Smith | 340/825.72 |
| 4,897,718 | 1/1990 | Testin et al. | 340/825.69 |
| 5,066,947 | 11/1991 | Kaneko | 340/825.69 |
| 5,153,580 | 10/1992 | Pollack | 340/825.69 |

*Primary Examiner*—Brian Zimmerman
*Assistant Examiner*—Edward Merz
*Attorney, Agent, or Firm*—Mueller and Smith, LPA

[57] ABSTRACT

Apparatus and method for switching between two input sources to a television receiver and/or video recording device. Switching may be carried out with a conventional remote control otherwise dedicated to the video recorder or television receiver by holding down a control button thereof for at least a predetermined interval of time, for example two seconds. Five RF diode switches along with solid state logic components are employed to respond to the remotely developed switching signals for carrying out TV receiver and VCR source selections by the viewer. The pre-existing television or VCR operational status is not affected by the remote controllers where an ongoing channel selection simply is reinforced or a function of the remote controller is elected which has no undesired effect upon that ongoing operational status.

5 Claims, 5 Drawing Sheets

RF SWITCHING WITH REMOTE CONTROLLERS DEDICATED TO OTHER DEVICES

This application is a division, of application application Ser. No. 08/488,999, as originally filed on Jun. 8, 1995, now U.S. Pat. No. 5,574,440, which is a division of prior application Ser. No. 08/174,224 as originally filed on Dec. 28, 1993 now U.S. Pat. No. 5,491,472.

BACKGROUND OF THE INVENTION

The television industry has evolved and continues to develop a wide variety of components functioning to receive and display, or record, television signals. Videotape or cassette recorders (VTR, VCR) have become common companions to television receivers. The VCR is sold with a continually expanding variety of advanced features permitting the VCR conversant user to achieve a variety of convenient results. For example, the user may program the VCR for the unattended recordation of various selectable channels at various times. Video recorders universally incorporate a signal splitting function such that all signals from a given source advantageously can be supplied to a companion television receiver as well as the VCR. This permits the recording of any selected source channel while at the same time conveying all source channels to the companion television receiver for immediate viewing of the same channel or of any other. Television receivers similarly have been provided with convenient embellishments such as "picture in picture", on screen channel identification, and the like.

Of substantial convenience to the user, hand-held remote controls for both VCRs and TV receivers have been developed and are essentially universally used for their control. By simply momentarily depressing a button actuated channel number or function switch on the remote controller, a coded infrared (IR) signal is broadcast to a photosensitive receiving circuit at the recording or receiving device to carry out the mandated control input.

The broadcasting performance of television programs also has undergone and continues to undergo change. Classically, the channel designated NTSC video signal has been broadcast for antenna reception at TV receivers. Cable systems, initially intended to bring television broadcasts to remote areas of the country, then expanded to the urban environment with the development of satellite "superstations" and "premium" channels for the use of which subscribers are billed. To provide a complete service by cable, the cable TV operators typically supply a "bundled" package of local channels and superstations as standard, or non-premium channels; while the premium channels are sold individually for an extra charge. A cable subscriber will typically receive all the standard channels and perhaps one premium channel such as HIBO, TMC, MAX, or the like. Pay per view services are also offered. To protect the premium and pay per view presentations, cable companies typically will "scramble" the transmission of those broadcasts and, in turn, install a "descrambler" with each subscriber, which may then in one way or another be activated by the cable operator to permit viewing by a subscriber who has purchased the premium signal. Interestingly, the typical descrambler is only capable of operating on one particular frequency, necessitating that any premium channel selected for viewing or recording must first be converted to that one frequency before it can be descrambled. Thus, the descrambler must be connected to the output of a frequency "converter box" or integrated into one. All channel tuning functions then, for both standard and premium channels, must by necessity be accomplished within the converter box. The converter, in effect, functions as a television receiver having an output which is directed to one channel, for example channel 03 of the subscriber's receiver. It becomes the channel tuning facility for the subscriber, for which he must normally pay a monthly rental fee. A remote control for the converter is typically offered to the subscriber, for yet another monthly fee.

The use of the described converters/descramblers causes many problems. Often, the descrambler is of such a design that it is activated continuously, even during the use of non-scrambled channels. This causes serious degradation of picture quality. Thus, even though the subscriber may have a high quality television system, that system is limited by the quality and type of the "cable box". Of particular interest, once the channel selection is required to be carried out by the converter box, the subscriber's TV and VCR controls can no longer be used for channel selection, nor can the remotes of those devices. Thus, for any television signal source representing the output of the converter box, the advanced features of the VCR cannot be employed. For example, the device cannot be programmed to record a selected channel at a future time and, for example, a different channel at another time, inasmuch as the channel tuning capability of the VCR has been lost. In similar fashion, the enhancement of the television receiver itself, for example displaying channel names or numbers or providing for picture in picture operations are lost. Even worse, it is no longer possible to record one channel while watching another, as the converter box is the only functioning tuning device. To ameliorate this, some cable operators will rent the subscriber two converter boxes, a less than desirable solution. It is clear that many desirable aspects of the subscriber's purchased equipment necessarily have been lost. The dilemmas posed to subscribers as above described in the United States has reached governmental consideration, for example, in the Cable Television Consumer Protection and Competition Act of 1992.

In an attempt to remedy these problems, many subscribers have resorted to the use of a splitter in conjunction with a simple RF, AB switch to select between standard channels received by cable or the output of the converter box. Here, the splitter is connected between the incoming cable and the converter box input. The split-off cable signal (Source A), or the output of the cable converter box (Source B) may then be mechanically switched into the "cable-ready" input of the subscriber's receiver. At times when the descrambler is not required, the cable operator's equipment is "bypassed" by selecting Source A, thus restoring all features and capabilities of the TV and VCR. However, many subscribers find this switching arrangement difficult to install, and the lack of remote-control switching is very inconvenient given that all other functions of the subscriber's equipment are generally remote-control. Although AB switches have become available which are actuated from a dedicated remote-control unit, it is generally considered that subscribers would loathe to acquire still another control device dedicated to this function. Further, if it is desired to employ this switching function independently for both the TV and VCR, this bypass procedure becomes much more complicated. While relatively complex "integrated" switching systems are available for this purpose through retail electronic outlets, they suffer from the same drawbacks as described for the AB switch. What's more, they typically incorporate additional signal splitting functions to achieve the logic of providing independent selection of either source for presentation to a VCR or TV receiver. With each such splitting procedure, of course, a degradation of signal strength is induced which represents approximately a 35% signal loss. While some of these devices will incorporate an amplification function to compensate for this, this may introduce other forms of degradation, and necessarily increases the cost of the device.

The difficulties encountered by televisions' component users having different signal input sources also occur outside of the field of cable, for instance, in satellite reception, antenna-based reception in combination with others, and the like. Accordingly, a user-friendly source control technique which returns many of the advantageous features of the receiving units including remote actuation, should be well received by the television viewing public.

SUMMARY

The present invention is addressed to apparatus and method for switching between two or more RF signal sources while employing the hand-held remote control supplied, for example, for the dedicated remote actuation of a television receiver (TV) or a video recording device (VCR). Thus, no additional remote controller which would be dedicated to this video source switching is required. To achieve such source switching while not disrupting the ongoing operational status of the television receiver or video recorder, a control button or switch on the television receiver or video recorder dedicated remote device is selected which does not change or which reinforces that then present status. By holding the selected control button down at least a predetermined interval of time which is longer than that interval normally required, for example, to switch channels or increase volume, source switching activity will ensue. To switch a source into a television receiver, the interval may be selected, for example, as two seconds. Correspondingly, to change the source input to an interconnected video recorder, the viewer presses the control button for a longer time interval, for example three seconds. By providing for an initial source selection at the television receiver, no disruption will be made to any ongoing recording being carried out by the video recorder while the user is in the process of changing a source input to a television receiver.

To achieve such complex source switching at practical costs with a minimum of components and maximum efficiency, advantage is taken of the signal splitting function of the video recorder itself. In particular, that universal feature is employed with a logic-based control which does not permit the same source to be directly applied simultaneously to both a television receiver and associated video recorder. In this regard, where the same source is selected for both the TV and VCR devices, the logic of the control mandates that the TV access its signal from the already split VCR source. Where the apparatus is employed with an entertainment installation having a cable signal passing through a cable converter box and which provides both premium and non-premium programming, an integral two-way splitter supplies the signal to that converter box to establish one source as a non-premium channel input and a second source as the output of the converter box. Typically that output will be one which represents a "descrambled" version of an incoming scrambled channel signal. Where the signal source selected is a non-premium channel input, the viewer is provided the use of all the various built-in programming and viewing features of the video recorder and/or television receiver. Should that signal source representing premium channel signals be utilized, then such features may be lost, but only at the election of the viewer. It should be noted that if only one premium channel is subscribed to, then, the converter box remote control transmitter is no longer needed. The converter box is simply left tuned to that channel. To aid the user in being cognizant of the source status then present for either or both the television receiver or the video recorder, visual indicators of that status are provided with the apparatus. In this regard, a green light emitting diode (LED) is energized during remote actuation procedures to indicate that a non-premium source is switched into the unit being controlled. The green indicator provides a universal information to the user representing a freedom to utilize the inherent features which may be provided with the recorder or receiver, such as the ability to record one channel while watching another, the recording of later broadcasts, or showing a picture in a picture form of display.

The invention, accordingly, comprises the apparatus and method possessing the construction, combination of elements, steps, and arrangement of parts which are exemplified in the following detailed disclosure.

For a fuller understanding of the nature and objects of the invention, reference should be had to the following detailed description taken in connection with the accompanying drawings.

DETAILED DESCRIPTION OF THE INVENTION

Figure 1:
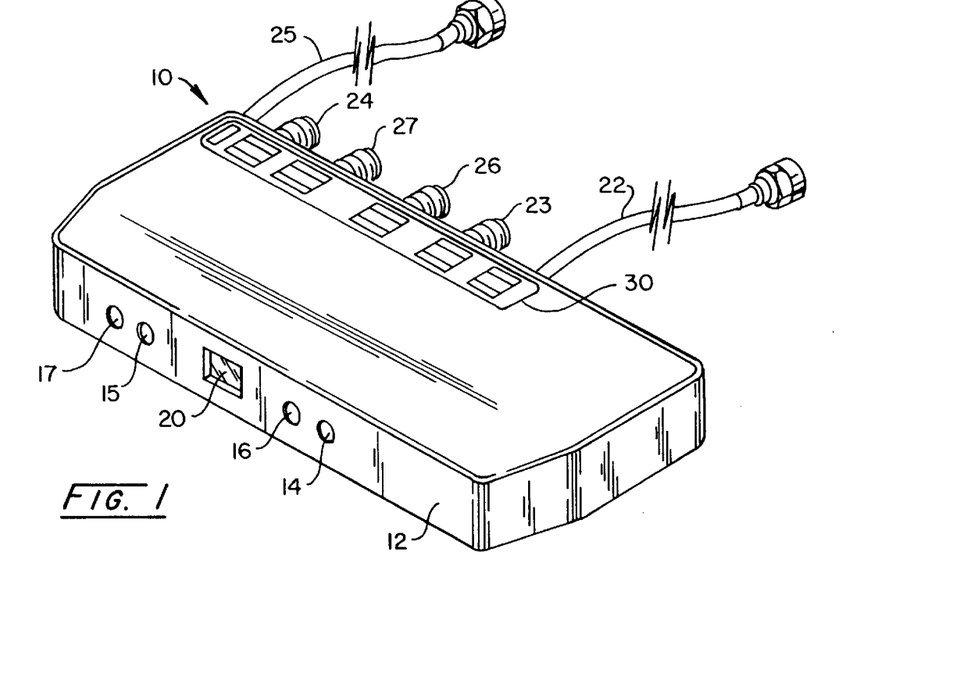
FIG. 1 is a perspective view of switching apparatus according to the invention.

Referring to FIG. 1, a perspective view of a principal embodiment of the switching apparatus of the invention is represented generally at 10. Switching apparatus 10 is intended for use in a home environment wherein two implements such as a television receiver and a VCR are operated in conjunction with two sources, for example, the output of a cable converter box and non-premium cable programming suited for a cable ready TV tuning system. Apparatus 10 achieves an RF switching function between these two sources with a desirably diminished use of signal splitter components and with an actuation procedure permitting the user to employ the hand-held remote control supplied, for example, with the television receiver or the VCR unit. By affording the opportunity to switch between the video sources, the user recovers all of the desirable features of the television receiver or VCR when premium programming is not in use. Of conveniently small size, the apparatus 10 may be dimensioned, for example, having a lengthwise extent of about 5½ in. (14 cm.), a widthwise extent of about 2½ in. (6.35 cm.), and a thickness of about ¾ in. (1.9 cm.). The bottom surface (not shown) of apparatus 10 typically carries a Velcro strip such that it may be mounted upon the top of a converter box or at some convenient location. The forward face of the device 12 is seen to provide four visual indicators which are implemented as green light emitting diodes (LEDs) 14 and 15 which are positioned adjacent red LEDs 16 and 17. LEDs 14 and 16 are associated with a VCR function, while LEDs 15 and 17 are associated with a television receiver function. The green LEDs, providing a universal implication of "free" or "unrestricted", represent that the switching system as associated with either a VCR function or a television receiver function is supplying a non-premium or non-scrambled source which permits full use of the remote controls and all other inherent features of an associated television receiver or VCR. Correspondingly, the red LEDs 16 and 17 are associated with a condition wherein a scrambled signal is at hand as associated with a premium channel and thus remote control utilizing TV or VCR remote control devices will be restricted as well as other features. Intermediate the LEDs 14, 16, and 15, 17 is a window 20 providing for reception of conventional IR coded inputs from a hand-held controller.

At the rear of the switching apparatus 10 are a sequence of six F-type connectors 22–27 which are identified by corresponding indicia (not shown) placed upon a label 30. The connector types and associated labeling provide for a quite simple installation of the switching apparatus 10 by the user. In this regard, an indicia at label 30 for connector 22 recites "TO BOX INPUT" which represents the cable input to a converter box. Note that connector 22 is of the male variety and incorporates a coaxial cable for ease of installation. The next connector 23 is labeled "TO CABLE" which is the female connection for the input signal of the cable otherwise extending to a cable converter box input. Female connector 24 is labeled "TO VCR INPUT" and male connector 25 is labeled "TO BOX OUTPUT" and also incorporates a coaxial cable as with connector 22. This is the connection with a potentially scrambled output of the converter box. The configuration of connectors 22 and 25 allows the apparatus 10 to be conveniently connected to an adjacent converter box without the need for additional coaxial cables. Thus configured, connectors 22 and 25 in the upcoming discourse will be referred to additionally as cable 22 and cable 25. The labeling thus far reveals that the apparatus 10 includes a splitter function splitting the incoming cable signal to derive two sources, i.e., that introduced to the converter box, and that at the output of the converter box. Connector 26 is labeled "TO TV", while connector 27 is labeled "TO VCR OUTPUT". The latter connector provides for making advantageous use of the splitter function within a VCR itself. This feature is one which permits the minimization of the number of splitters employed in the switching arrangement.

Figure 2:
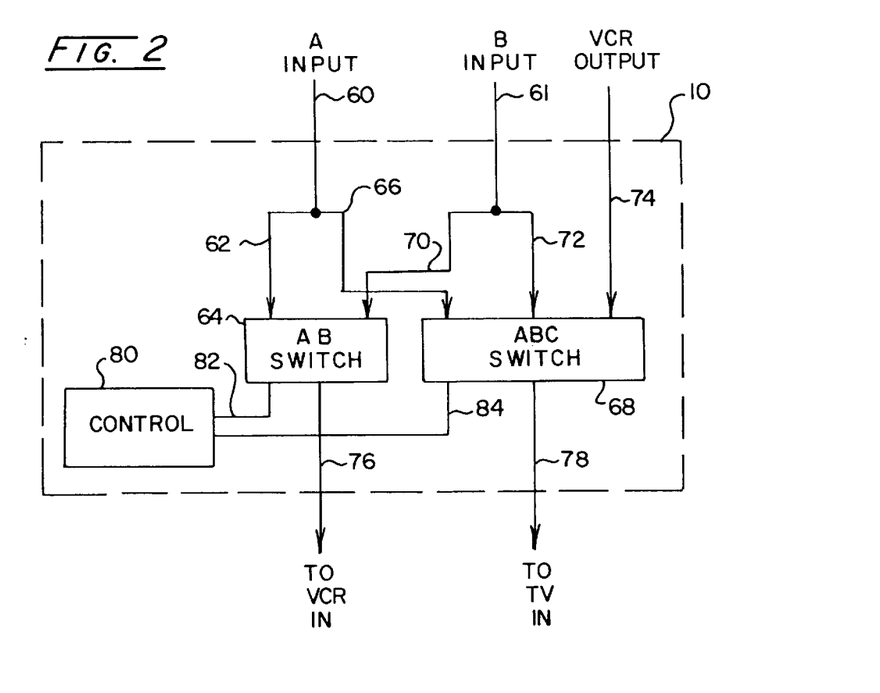
FIG. 2 is a block diagrammatic representation of components of the switching apparatus according to the invention.

Referring to FIG. 2, a block diagrammatic representation showing the switching paths and splitter requirements of the switching apparatus 10 is revealed. In the figure, the apparatus is again represented with the numeration 10 leading to a dashed boundary. Not shown is an initial splitter function extending from the source to the cable converter box which provides a non-premium cable output identified as a source "A input" and a premium signal emanating from the converter box which is identified as a source "B input". These inputs are shown in the drawing respectively at 60 and 61. The output from lead 60 extends, as represented by arrow 62, to an AB switch represented at block 64. Additionally, an arrow carrying the same source from lead 60 at 66 is seen to extend to one of the three inputs of an ABC switch represented at block 68.

Lead 61, extending for example from the output of the converter box, is seen directing a signal via arrow 70 to the second input of AB switch 64, and through arrow 72 to the second input to switch 68. The third input to switch 68 is derived as the output of a VCR as represented at arrow 74. With the arrangement shown, the output of AB switch 64 is directed to the input of a VCR as represented at arrow 76 and the output from ABC switch 68 is directed to the input of a television receiver as represented at arrow 78. A control network as represented at block 80 provides a logic control over switches 64 and 68 as represented by respective lines 82 and 84. Under the logic asserted from control 80, the VCR and television receiver components utilized with switch 10 will not receive signals directly from the same source. For example, should the VCR be fed with a non-premium cable signal, the television receiver, when receiving the same signal source, will receive that source from the splitting function of the VCR.

Figure 3:
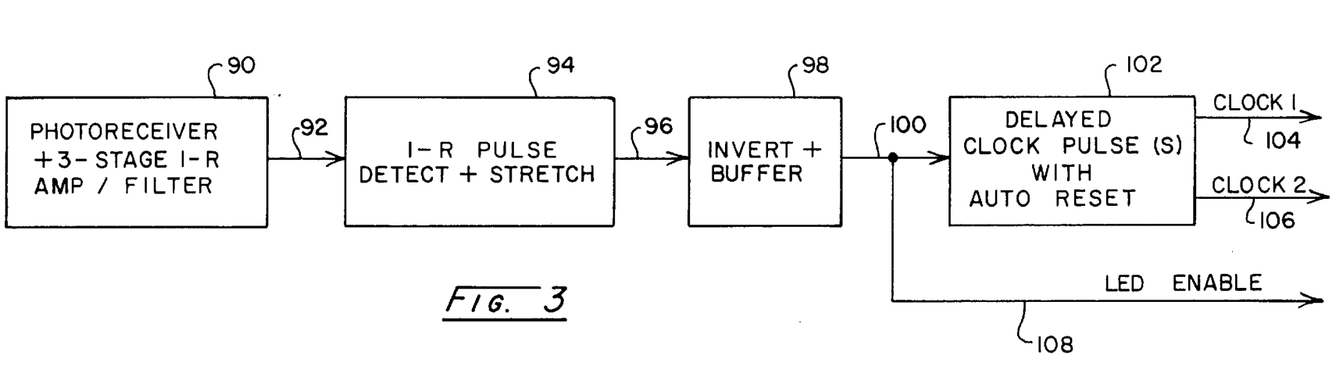
FIG. 3 is a diagrammatic representation of a universal IR code receiver employable with the apparatus of FIG. 2.

Now considering the universal remote actuation feature of the switching apparatus 10, reference is made to the block diagrammatic representation of FIG. 3. In general, the receiving IR circuit is one which is not designed to respond to infra-red pulsed coding from a remote TV or VCR control. The IR response of the circuit is one which is concerned with the duration of the incoming broadcast radiation pulses. In this regard, the device will carry out the generation of switching conditions in the event that the broadcast IR pulses are sustained for a period lengthier than that normally employed by users to carry out a remote command. This interval preferably is two seconds, but should be at least about one-half second. Any subsequent activation of the broadcasting controller for that predetermined interval of time following a release of the activating button will cause the actuating feature to assume its initial condition. In general, the first or two second interval to which the device responds provides output conditions for carrying out a solid-state source switching at the television receiver. Where the user actuates a given code broadcasting switch or button of the remote control for a longer period, preferably three seconds, but not less than about one second, without interruption, then the circuit additionally will respond to provide alteration from the stated first or second output condition to a third or fourth output condition. Conversely, a next actuation of the remote controller for such a three second interval will cause the receiving circuit to revert to the initially present first or second condition. This second period actuation will be seen to be employed in conjunction with control over a VCR. When switching the VCR source, the TV source will end up where it started, i.e. it reverts. By so providing for a longer uninterrupted interval of depression of the remote controller, the switching technique provided will not adversely interfere with any ongoing VCR recording while the television receiver source input is being altered. To accommodate for the broadcasting of a coded IR signal toward a receiver such as a television set or a VCR having a detector circuit functioning to decode impinging coded signals, the user simply presses a button or switch on the remote unit which has no undesired actuation effect. For example, assuming power is on, a non-actuating function or numeric button may be pressed, for example, a button which would reinforce the current operating condition of the unit such as the VCR or TV. For example, the digits (or zero) of the television channel then in use may be pressed, with the final digit sustained, to switch sources with no actuation effect on the video device. Where the VCR is recording, and its control unit is utilized, then pressing the recording button for the requisite interval of time will carry out the instant switching function with only a reinforcing effect at the VCR itself. Thus, the user may employ either the VCR remote control or the television receiver remote control or any other such remote control to provide source switching utilizing apparatus 10. FIG. 3 shows that the universal IR responsive circuit includes, as represented at block 90, an infrared photoreceiver, the output of which is directed to three stages of amplification and filtering. The amplification is called for in conventional fashion to amplify the relatively low photo currents developed by IR responsive diodes. The thus-filtered and amplified coded pulse signals then are directed, as represented at arrow 92, to a pulse detection and stretching network represented at block 94. This circuitry functions to first detect the pulsed signal generated from circuitry 90 and then to, in effect, stretch the interval of such pulses at least to the extent of the interval by which successive pulses are separated. This then presents, in effect, a continuous signal at arrow 96 which remains uninterrupted as long as the user is depressing a button of the remote control unit. The resultant continuous signal then is inverted and buffered as represented at block 98, and the resulting signal is directed as represented by line 100 and block 102 to a network which functions to generate switch actuating clock pulses or conditions following the noted predetermined intervals. Any release by the operator of the button before causing actuation will result in an automatic reset of the network 102. As represented at arrow 104, the depression of the remote control unit actuating button to broadcast a coded IR signal for about two seconds will result in the generation of a "CLOCK 1" pulse. By depressing the actuating button at the remote controller for a longer interval, for example three seconds, the network 102 will generate a next condition at arrow 106 herein labeled "CLOCK 2". The CLOCK 1 condition at arrow 104 is used for the actuation of switching apparatus 10 with respect to a TV receiver source, while the condition at arrow 106 carries out switching of sources with respect to the VCR. LEDs 14–17 (FIG. 1) are selectively enabled only during the switching procedure to conserve battery power and the enablement of this illumination network is represented at arrow 108 labeled "LED ENABLE".

Figure 4:
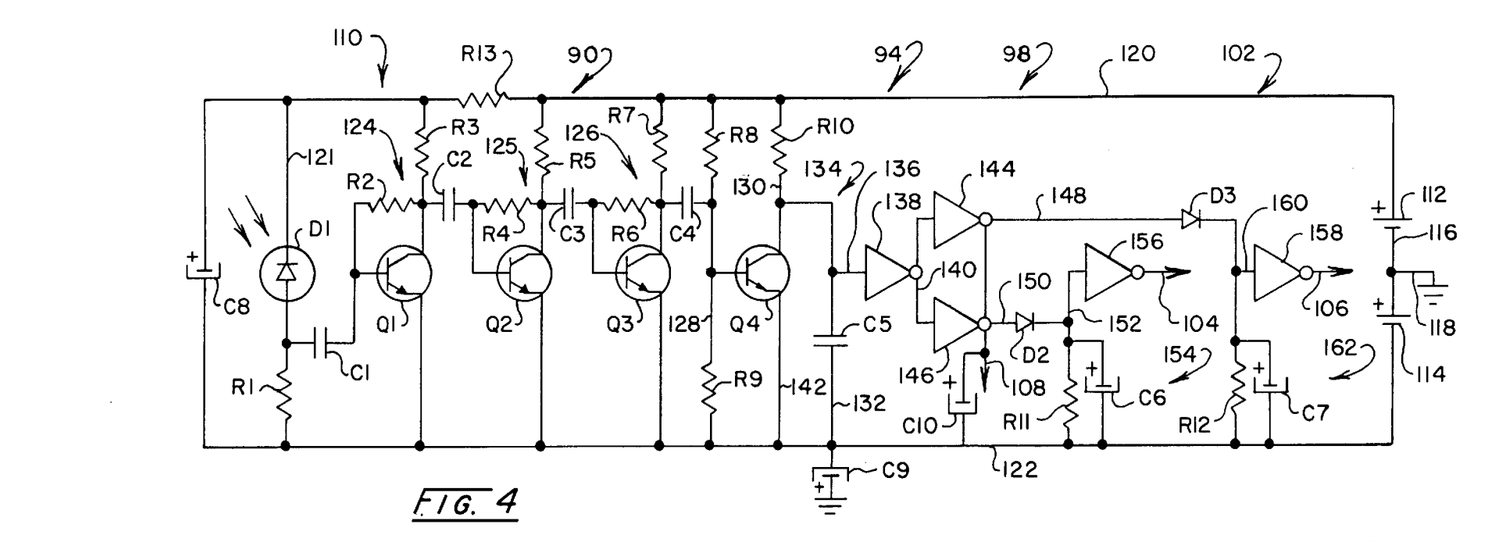
FIG. 4 is an electronic schematic diagram of the circuit of FIG. 3.

Turning to FIG. 4, the code immune pulsed radiation responsive circuit of FIG. 3 is depicted at an enhanced level of detail. In the figure, the component groupings represented by the block diagram of FIG. 3 are represented by the same numeration in general form. The universally responsive circuit as represented at 110 is seen to be powered from a split battery supply including batteries 112 and 114, the center tap of which at line 116 is coupled to chassis ground as represented at line 118. The positive terminal of battery 112 is coupled to power lead 120 while the negative terminal of battery 114 is coupled to power lead 122. Batteries 112 and 114 also will be seen to represent the power supply for the logic control circuitry and RF switches as discussed in connection with FIG. 2. Leads 120 and 122 are seen to extend to the photoreceiver and amplification/filter stages 90. In this regard, an IR responsive photodiode D1 is shown connected within line 121 such that its cathode is coupled through resistor R13 with positive power lead 120 and its anode is coupled through companion resistor Ri to power lead 122. For further discourse concerning the utilization of such photodiodes, reference is made to: "Optoelectronics Applications Manual", McGraw-Hill Book Co., Chapter 4, 1977. With the arrangement shown, the low level photo current developed at diode D1 in response to impinging infrared radiation is read across resistor R1 and presented to a first amplification stage 124 of a cascaded grouping thereof 124–126. Additionally carrying out a filter function removing such ambient illumination-based signals as may be witnessed, for example, at 60 Hz, stages 124–126 are essentially identically structured. In this regard, stage 124 is seen to be comprised of NPN transistor Q1 performing in conjunction with capacitor C1 and resistors R2 and R3. In similar fashion, the initially amplified and filtered signal at stage 124 is again amplified at stage 125 which includes NPN transistor Q2 performing in conjunction with capacitor C2 and resistors R4 and R5. Stage 126 similarly is comprised of NPN transistor Q3 performing in conjunction with capacitor C3 and resistors R6 and R7. The resultant, amplified and filtered or treated signal then is presented via coupling capacitor C4 to the detecting components of IR pulse detection and stretching function 94. The detection component of the circuit includes NPN transistor Q4, the base of which is coupled to the center tap of a voltage divider including resistors R8 and R9 within line 128. Resistors R8 and R9 provide an initial bias at the base of transistor Q4 enhancing the sensitivity thereof to respond and conduct in the presence of a valid amplified IR pulse signal.

The collector of transistor Q4 is coupled via line 130 and resistor R10 to lead 120. A capacitor C5 within line 132 extending, in turn, from line 130 to lead 122 functions to define an RC network represented generally at 134. Network 134 is seen tapped at line 136 which extends to the input of a Schmitt inverter 138 having an output line 140. With the arrangement shown, capacitor C5 of network 134 is normally charged providing for a logic high input at line 136 to gate 138. The resulting output of gate 138 at line 140 is then a logic low. However, with the receipt of a pulse signal at the base of transistor Q4, that device conducts, its emitter being coupled via line 142, to lead 122. As a consequence, capacitor C5 will immediately discharge, causing the signal or logic level at line 136 leading to gate 138 to transition to a logic low value to, in turn, cause the output of gate 138 at line 140 to assume a high logic value. Capacitor C5, having discharged through transistor Q4, begins to recharge through resistor RIO pending the receipt of a signal representing a next pulse in sequence. Thus, the RC network, performing in conjunction with transistor Q4, serves a pulse stretching function. In general, this stretching activity is at least as large or larger than the time elapsing until the arrival of a next pulse in sequence. Accordingly, by holding down a given actuating button of a remote TV or VCR control, the user will cause a continuous high logic level at line 140. This logic high signal is introduced to the inputs of two, parallel connected Schmitt inverters 144 and 146 having respective outputs at lines 148 and 150. The outputs of these devices 144 and 146 also are commonly coupled to the LED enable line 108 as described in connection with FIG. 3. Thus combined, the devices support the current requirements for the LEDs utilized with the system, for example those described in connection with FIG. 1 at 14–17. These Schmitt inverters represent components of the inverter buffer function 98 described in connection with FIG. 3. Thus configured, LED enable line 108 is logic low true and, provides for the energization of select ones of the LEDs only for the interval wherein the user is depressing a given button switch of a remote controller. This serves to conserve battery power supply. A capacitor C10 is coupled between line 108 and line 122 to prevent any feedback which might be caused by the sudden transitions occurring at line 108.

Output line 150 extending from inverter 146 incorporates a diode D2 and extends, in turn, to line 152 which is coupled to an RC timing network represented generally at 154 and including resistor R11 and capacitor C6. Line 152 extends upwardly from network 154 to the input of a Schmitt inverter 156. When detector transistor Q4 is not conducting in response to an applied pulse signal, line 150 is retained at a logic high level. Thus, diode D2 is forward biased and capacitor C6 of the network 154 is charged, a high logic level being applied at the input to inverter 156 and a low logic level being witnessed at its output at line 104. Line 104 has been described as a "CLOCK 1" output condition in conjunction with FIG. 3. The arrangement of the diode D2, network 154, and inverter 156 provides the earlier-described delay clock function with auto reset identified at block 102 and identified by the same numeration herein. As the system receives a remote control pulse and transistor Q4 is biased into conduction, the logic level at line 150 reverts to a logic low level. This permits a gradual discharge of capacitor C6 through resistor R11 over a first predetermined interval, for example two seconds, whereupon line 152 assumes a low logic level and gate 156 transitions to provide a logic high output as the "CLOCK 1" condition at line 104. However, should the user release the button switch of a remote controller prior to the expiration of that predetermined two second interval, then diode D2 is forward biased and capacitor C6 immediately is charged to maintain the logic high level at line 152 and a logic low condition at line 104. As noted earlier, the logic condition at line 104 functions to provide a TV source selecting action at control 80 (FIG. 2).

Where two devices such as a television receiver and a VCR are employed with the source selection feature as described in conjunction with FIGS. 1 and 3, then a second time interval requirement for remote control button switch actuation is provided in conjunction with function 102. This second timing feature is implemented with the output of inverter 144 at line 148. Line 148 is seen to extend through diode D3 to the input of a Schmitt inverter 158 via line 160 and to an RC timing network represented generally at 162 and comprised of resistor R12 performing in conjunction with capacitor C7. Operating in the same manner as RC timing network 154, capacitor C7 of network 162 is normally charged in conjunction with the normal forward biasing of switching diode D3. Upon the occurrence of a valid pulse signal sequence and the conduction of transistor Q4, line 148 assumes a logic low condition to remove the forward bias at diode D3 and permit commencement of the discharge of capacitor C7 through resistor R12. The time constant for network 162 is selected as greater than that at network 154, for example about three seconds. With the arrangement shown, should the user interrupt the transmission of coded IR signals, diode D3 immediately will be forward biased with the assumption of a logic high at line 148 and capacitor C7 of network 162 will be charged. However, should the user retain a switched on condition at a remote controller, for the requisite interval, for example three seconds, then at the terminus of that three seconds, line 160 will have reached a logic low value and the resultant output condition at "CLOCK 2" at line 106 will be a logic high. Preferably, this switching condition is employed for the selection of source inputs to a VCR and occurs following any switching or source alteration in conjunction with the "CLOCK 1" status at line 104. To prevent disruptive feedback between amplification stages, a decoupling arrangement is provided comprised of resistor R13 and capacitor C8, the former being mounted within line 120. Such arrangements are well known in the art. In similar fashion, by-pass capacitor C9 is provided between the negative line 122 and chassis ground to prevent unwanted amplification of ambient electromagnetic fields such as the 60 Hz power field and RF signals experienced in proximity to TV receivers and the like.

Figure 5:
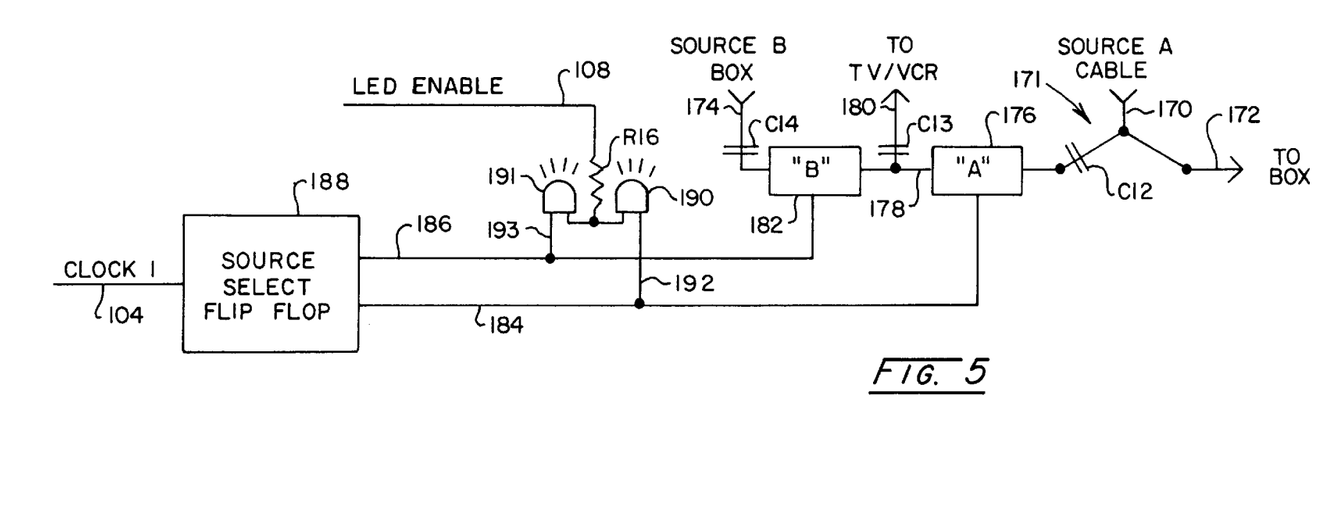
FIG. 5 is a block type electronic schematic diagram of a switching apparatus which may be employed with a detector configured according to FIG. 3.

Circuit 110 not only may be employed with the dual implement, i.e. the television receiver and VCR configuration of FIGS. 1 and 2, but also may be utilized with a more simple AB switch function to permit a user to elect, for example, whether to apply the output of a converter box or non-premium channel signals to a single component, for example, a television receiver or, perhaps, a VCR. By combining the circuit 110 with that switching function, the user may conveniently switch between sources utilizing a remote control device having a coded output dedicated to the component receiving a broadcast. Referring to FIG. 5, such an arrangement is revealed in generalized diagrammatic form. As is apparent, only one delay stage, for example providing a two second requirement for activation as described in connection with line 104, is employed. Accordingly, in FIG. 5, line 104, carrying the "CLOCK 1" condition is again represented with the same numeration. The arrangement of FIG. 5 initially provides for the selection of source A as at line 170, for example representing a non-premium cable input. This source, as described above, may be split by a two-way RF power splitter as represented generally at 171, to provide an input to a cable converter box via line 172. The output of that cable converter box then may become a second source or source B, the input of which is represented at line 174. In the discourse to follow, switch configurations will be seen to be described and illustrated as "diode switches". To identify switching operation, all switching functions are described with classic terms "electrically open" representing signal blocking, and "electrically closed", representing a condition conveying a signal. Source A at line 170 is seen directed through coupling capacitor C12 to an "A" RF switching function represented at block 176. The output of function 176 at line 178 is seen directed through coupling capacitor C13 and line 180 to a device such as a television receiver or a VCR. In similar fashion, the source B signal, for example, from a converter box, is directed through a coupling capacitor C14 to an RF, "B" switching function represented at block 182 also having an output at line 178. Switching functions 176 and 182 are, in turn, controlled as represented by respective lines 184 and 186 by a control network incorporating a flip-flop based source select function represented at block 188 which is toggled between alternate complimentary output conditions at lines 184 and 186 in response to a rising CLOCK 1 logic high condition at line 104. LED enable line 108 reappears in the figure in conjunction with resistor R16 which, in turn, is coupled to one electrode of each of two LEDs 190 and 191. The opposite electrode of LED 190 is coupled via line 192 to switch control line 184, while the corresponding opposite electrode of LED 191 is coupled via line 193 to control lead 186. In accordance with the invention, the positive going commencement of a logic high true condition at line 104 alternately results in a corresponding logic high condition at line 184 causing the actuation to an electrically closed condition of switching function A at block 176, and in combination with a low true condition at line 108 provides for the illumination of LED 190. This provides for the delivery of source A non-premium cable to line 180. Accordingly, LED 190 would be selected for emission in the green region of the visible spectrum. Conversely, a next successive logic high going signal at line 104 reverses the logic levels at lines 184 and 186, for example, providing a logic high level at line 186 to actuate switching function 182 to an electrically closed condition and together with a low true condition at line 108, illuminates LED 191. This provides for the delivery of a converter box output to lines 178 and 180. For both switching conditions described, one of the switch control lines 184 or 186 will be at logic low, causing an electrically open condition of function 176 or 182, respectively.

Figure 6:
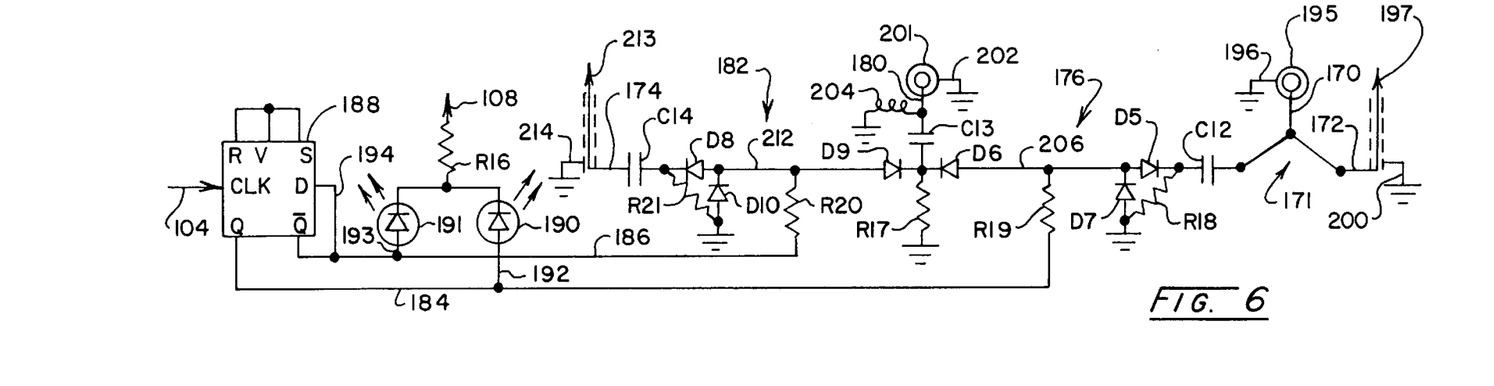
FIG. 6 is an electronic schematic diagram showing the circuit of FIG. 5 at an enhanced level of detail.

Looking to FIG. 6, the universally remotely controllable AB switch of FIG. 5 is illustrated at an enhanced level of detail. Here the source select flip-flop function 188 is seen to be provided as a D flip-flop, the clock terminal of which is coupled with CLOCK 1 condition carrying line 104, the Q output of which is coupled to line 184 and the $\overline{Q}$ output of which is coupled to line 186 as well as through feedback line 194 to the data, "D" terminal. Thus, a positive going pulse at line 104 will alternately toggle high and low logic levels at lines 184 and 186. LEDs 190 and 191 reappear with the same numeration and network for enablement including enabling line 108 and resistor R16, as well as lines 192 and 193.

In the invention, "F-Type" connectors preferably are utilized such as connectors 22–27 shown in FIG. 1, which are suitable for mating to television receiving equipment and associated F-type coaxial installation cables. Looking back to FIG. 6, F-type connector 195 has a metallic body which is grounded via line 196 and a center conductor attached to source A line 170. Line 170 may be input to a splitter 171 as described earlier, one side of which provides source "A" to the converter box via line 172 as an F-type coaxial cable 197 with a shield grounded via line 200. Line 180 reappears attached to F-type connector 201 which is grounded as represented at line 202 and further including an inductor form of filter 204 connected between line 180 and ground. Switching function 176 is shown to be provided as an RF diode switch which is actuated from line 184. The diode switching function 176 is formed of diodes D5 and D6 within line 206 and diode D7 which is coupled between line 206 and ground. Resistors R17 and R18 are coupled from ground to the cathodes of diodes D6 and D5, respectively, to provide cathode biasing for same. In similar fashion, the anode of diode D7 receives biasing by virtue of its direct connection to ground. Note that ground represents a valid biasing electrode due to the center tap arrangement of batteries 112 and 114 as shown in FIG. 4. To actuate the diode switching network 176, a high true signal is applied from flip-flop 188 along line 184 and resistor R19 which functions to forward bias diodes D5 and D6 and back-bias diode D7. This causes an electrically closed condition of switch function 176, permitting the signal from cable source 195 to flow to output 201, with coupling capacitors C12 and C13 serving to isolate the diode network from external equipment. Conversely, with a low true condition at line 184, diodes D5 and D6 are back-biased while diode D7 is forward biased, creating an electrically open condition of switch function 176. For additional discourse concerning diode switching, reference is made to the *Radio Amateur's Handbook*, American Radio Relay League, Newington, Conn. 06111, Chapter 4, pp. 4–6, 57th Edition, 1980.

Under the instant D flip-flop logic, where the Q terminal of device 188 is at a logic low, the $\overline{Q}$ terminal thereof and line 186 is at a logic high. This switching logic high value is presented through resistor R20 to line 212 of the "B" switching function represented generally at 182 and implemented, as before, as a diode switch. Line 174 reappears attached to F-type coaxial cable 213, the shield of which is grounded through line 214, and which is isolated from diode network 182 by capacitor C14. Note that line 212 incorporates diodes D8 and D9, while diode D10 is coupled between line 212 and ground. Resistors R17 and R21, being coupled to ground, serve to provide cathode biasing for diodes D9 and D8, respectively. Note that the cathode bias provided by resistor R17 is shared by both diode D9 of switch function 182 and diode D6 of switch function 176. Thus configured, the diode network at 182 performs in the same manner as that at 176 but in conjunction with the logic level presented at line 186 through resistor R20 from flip-flop 188. Note that the described center tap to ground arrangement of batteries 112 and 114 need not be physically provided, as the logic levels of control lines 184 and 186 are always complimentary. Therefore, switch functions 176 and 182 will act as the two elements of a voltage divider, with the chassis ground acting as a center top thereof, by virtue of the instant diode networks' unique configuration. Switching diodes D5–D10 may be provided, for example, as type MA73 (Panasonic).

Figure 7:
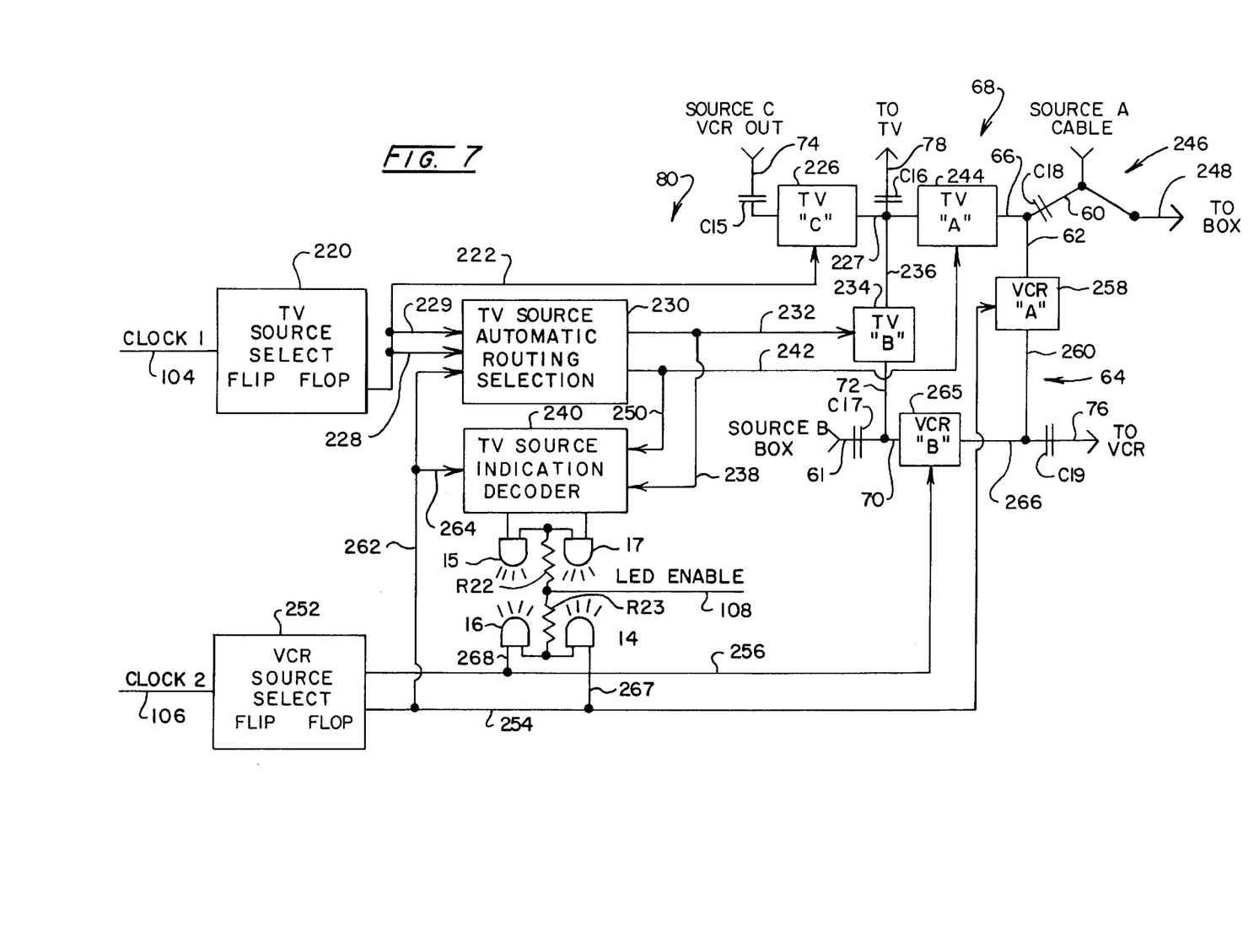
FIG. 7 is a block schematic diagram of the switching and related control features of the apparatus of FIG. 2.

Referring to FIG. 7, an enhanced block diagrammatic representation of the switching and related control features of apparatus 10 as earlier discussed in connection with FIG. 2 is revealed. Where appropriate, numeration identifying components in FIGS. 1 and 2 is retained for such identification in general in conjunction with FIG. 7. In this regard, the AB switch represented at block 64 in FIG. 2 is identified in general by that numeration in FIG. 7, and the ABC switch function represented at block 68 in FIG. 2 is shown generally with that numeration in FIG. 7. In FIG. 7, the "CLOCK 1" logic high true signal, as discussed earlier is presented from along line 104 to a TV source select flip-flop function represented at block 220. Actuation of the flip-flop function 220 provides for alternating logic high and logic low values at its output as represented at line 222. The control condition at line 222 is conveyed for the purpose of carrying out a switching function to the "C" component 226 of ABC switch function 68. Switching function 226 is seen to be coupled through capacitor C15 to a source C which may be the output of a VCR as labeled and represented by earlier numeration 74. Switching function 226 also is coupled to line 227 which extends through capacitor C16 to line 78 which reappears from FIG. 2 and is connected to the television receiver input.

Returning to line 222, the TV source flip-flop function 220 also is seen to be directed via lines 228 and 229 to a TV source automatic routing selection function represented at block 230, corresponding in general to control block 80 as shown in FIG. 2, which serves to insure that the two receivers will not be directly connected to the same source at any time. The logic circuitry of function 230 provides one output as represented at line 232 which functions to actuate the "B" component of ABC switch 68 as represented at block 234. Switching function 234 serves to selectively convey the output, for example, from a converter box as shown at line 61 through capacitor C17 and lines 72 and 236 to the television receiver input as earlier-described at line 78, via capacitor C16. That same logic as represented at line 232 also is conveyed as represented at line 238 to a TV source indication decoder logic circuit as represented at block 240. This circuit serves to select, as may be appropriate, either the green light emitting diode 15 or the red light emitting diode 17 (see FIG. 1) in the presence of a low logic level true enabling signal from earlier described line 108 (FIG. 3) as applied through resistor R22.

The TV source routing logic at block 230 also provides, as represented at line 242, a control input to component "A" of ABC switch function 68 as represented at block 244. Switching function 244 is seen functioning to communicate signals representing non-premium cable derived from line 60 through capacitor C18 and line 66 to the television receiver via line 227, capacitor C16, and line 78. Note that a two-way RF power splitting function is represented at 246 providing for the submission of non-premium cable signals through lines 66 and 62, and, as represented at line 248, providing cable signals to the input of a converter box. Line 248 corresponds, for example, with cable 22 as described in conjunction with FIG. 1. The signal condition at line 242 also is conveyed via line 250 to the television source indication decoder logic circuitry at block 240, and also aids function 240 in carrying out its task as mentioned above.

Where the user of a remote control device retains an appropriate button in a closed switch orientation for at least about three seconds, then the logic condition at "CLOCK 2" at line 106 causes an alternating selection at a VCR source select flip-flop function represented at block 252. The flip-flop function at block 252 provides alternating outputs as represented at lines 254 and 256. Note that line 254 extends to block 258 representing the "A" switching component of the AB switch function 64. Switching component 258 is coupled via line 62, capacitor C 18, and line 60 to non-premium cable signals and provides a switching path via lines 260, 76, and capacitor C19, to the input, for example, of a VCR. As noted above, with the apparatus 10, use is made of the two-way splitting function of the VCR device. As a consequence, the logic associated with the television controls as represented at blocks 230 and 240 is responsive to the condition at line 254. In this regard, a television receiver and VCR will not be directly connected to the same source simultaneously, the television receiver, for certain conditions, taking its source or feed from the output of the VCR. Accordingly, as represented at line 262, extending to block 230, and lines 262 and 264 extending to block 240, the condition of line 254 is part of the switching logic and LED selection decoding carried out at the latter two blocks.

Line 256 extending from the flip-flop function 252 leads to block 265 representing the "B" switching function of AB switch function 64. Switching component 265 is seen to convey source B, i.e. the output of a cable converter box via lines 61, capacitor C17, and line 70 to the VCR input via capacitor C19 and lines 76 and 266.

LEDs 14 and 16 are identified in the figure having one electrode coupled through resistor R23 to the LED enable line 108. Green region emitting LED 14 is seen coupled via line 267 to line 254 so as to be activated in the presence of non-premium cable signals to a coupled VCR device. Correspondingly, red region emitting LED 16 is coupled via line 268 to line 256. Thus, with the presentation of the low true signal at line 108, the source status for both TV and VCR are represented by the selective illumination of two of the LEDs 14–17.

Figure 8:
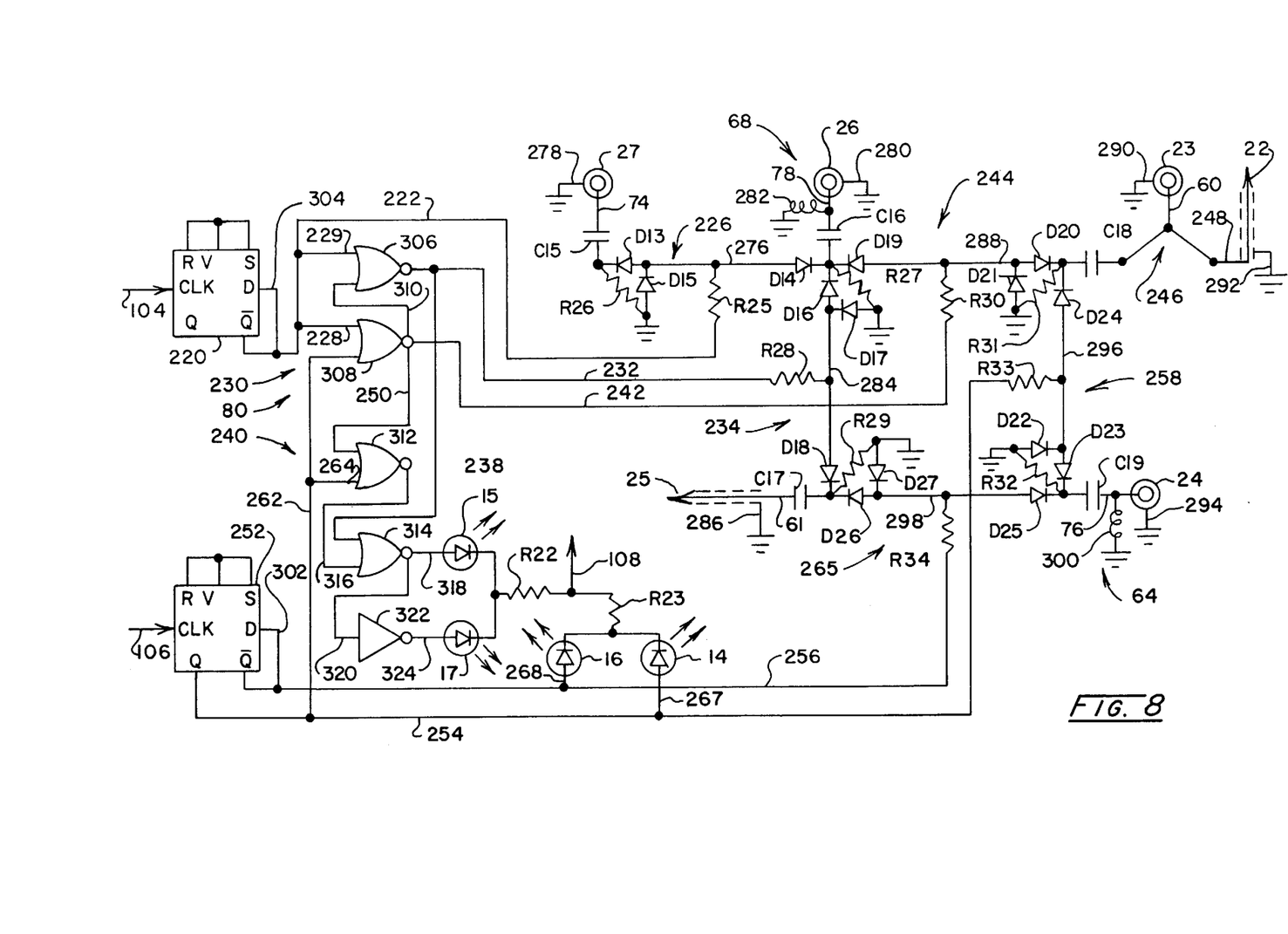
FIG. 8 is an electronic schematic diagram of the circuit of FIG. 7 showing the components thereof at an enhanced level of detail.

Referring to FIG. 8, an electrical schematic representation of the circuit described in connection with the block diagram shown at FIG. 7 is revealed. To promote an understanding of the correspondence between these figures, where appropriate, the same numeration is used in FIG. 8 as shown in FIG. 7. In the figure, switch control lines 222, 232, 242, 254, and 256 reappear which serve to actuate the also reappearing switching functions 226, 234, 244, 258, and 265, respectively. Switch functions 226, 234, and 244 once again correspond in general to the ABC switch 68 of FIG. 2, just as switch functions 258 and 265 relate to AB switch 64 of that figure. Also note the reappearance of cables (22, 25) and connectors (23, 24, 26, 27) from FIG. 1. Control line 222 is directed through resistor R25 to line 276 incorporating switch function 226. Function 226 as well as the other switch functions shown in FIG. 8 are configured in the same manner as the diode switches described in conjunction with FIG. 6. In this regard, it may be observed that the anodes of diodes D13 and D14 are coupled with the cathode of diode D 15. The anode of diode D15 is biased by its direct connection to ground, while grounded resistors R26 and R27 provide cathode bias to diodes D13 and D14, respectively. Thus configured, when diodes D13 and D14 are forward biased, diode D15 is reverse biased and vice versa. With the imposition of a logic high condition at line 222, switch function 226 (TV C) assumes an electrically closed condition. This creates a "C" signal path from connector 27 grounded at line 278 to connector 26 (TV) grounded at line 280, via capacitors C15, C16 and lines 74 and 78. Note that line 78 is coupled to an inductor form of filter 282, one end of which is grounded. Inductor 282 serves to shunt stray low frequency voltages emanating from the TV tuner at connector 26, and is operational at all times regardless of the present switching status of the invention. When line 232 is at logic high, this is asserted through resistor R28 to line 284 which actuates switch function 234 (TV B) to an electrically closed condition. Switch function 234 is formed of diodes D16–D18 and resistors R27 and R29, and serves to create a "B" signal path from cable 25, grounded at line 286, to connector 26 (TV), via capacitors C17, C16 and lines 61 and 78. In the same way, when line 242 is at logic high, this is conveyed by resistor R30 to line 288 which actuates switch function 244 (TV A) to an electrically closed condition. Function 244 includes diodes D19–D21 and resistors R27 and R31, and forms an "A" signal path from connector 23 grounded at line 290 to connector 26 (TV), via capacitors C18, C16 and lines 60 and 78, as well as splitter function 246. The other output of splitter 246 may provide "A", or non-premium cable signals via line 248 to a converter box via cable. 22, which is grounded at 292. These "A" signals presented to connector 23, which pass through line 60, splitter 246 and capacitor C18 may also be directed to connector 24 (VCR) which is grounded at line 294, via switch function 258 (VCR A) as well as capacitor C19 and line 76. Switch function 258 consists of diodes D22–D24 and resistors R31 and R32, and may be actuated to an electrically closed condition by imposing a logic high level at line 296, asserted through resistor R33 by control line 254. In the same way, the "B" signals present at cable 25 and passing through line 61 and capacitor C17 may also be supplied to connector 24 (VCR) via capacitor C19 and line 76, by utilizing switch function 265 (VCR B). Function 265 is formed of diodes D25–D27 and resistors R29 and R32, and is actuated to an electrically closed condition by applying a logic high level upon line 256, which is asserted through resistor R34 to line 298. Note that line 76 is connected to an inductor 300, one end of which is grounded. Inductor 300 serves the same purpose with respect to a VCR tuner, for example, as previously described inductor 282 serves with respect to the TV tuner. It has been described how each of the five RF switching functions assume an electrically closed status in response to a logic high condition at the corresponding control line. Conversely, each of these five switching functions will assume an electrically open status in response to a logic low condition at the same control line, due to the operation of the diode networks as described earlier.

Focusing now on the associated control logic for these five "port to port" switches, the VCR source select flip-flop function 252 of FIG. 7 is seen here to be provided as a D flip-flop with the same numeration, the clock terminal of which is coupled with the CLOCK 2 condition carrying line again identified at 106. The Q output of flip-flop function 252 is seen coupled to line 254 while the $\overline{Q}$ output is coupled to line 256 as well as through feedback line 302 to the data, "D" terminal, such that a positive going pulse at line 106 will alternately toggle high and low logic levels at lines 254 and 256. Green LED 14 and red LED 16 also reappear from FIG. 7, and are once again coupled to lines 254 and 256 via lines 267 and 268, respectively. Note that flip-flop 252 in combination with switch functions 258 and 265 and LEDs 14 and 16 operates in precisely the same manner as the AB switch described in FIGS. 5 and 6. This also corresponds in general to the AB switch function 64 of FIG. 2, which is represented by that same numeration here. When the Q output of flip-flop 252 is at logic high, this is transmitted via control line 254 to actuate switch function 258 (VCR A) to an electrically closed condition, as previously described. This allows the passage of source "A", for example non-premium cable, signals from connector 23 and via splitter 246 to connector 24, which may be coupled to the input of a VCR. With the Q output of flip-flop 252 being a logic high, the $\overline{Q}$ output is, of course, at logic low. This logic level as conveyed by line 256 causes switch function 265 (VCR B) to assume an electrically open condition, thus preventing the source "B", for example premium cable, signals presented to cable 25 from passing through to the VCR input at connector 24. When the user wishes to remotely switch to a status wherein the VCR is to receive source "B" signals from cable 25, any appropriate button on the remote transmitter at hand is depressed for the longer of the two prescribed intervals, for example 3 seconds. During this interval, the logic low true condition present at LED enabling line 108 is conveyed to LEDs 14 and 16 via resistor R23, thus illuminating green LED 14 by virtue of its coupling to line 254 via line 267. At the culmination of this interval, the positive going transition at line 106 will, of course, cause a reversal of the logic levels at the Q and $\overline{Q}$ outputs of flip-flop 252. At this time, the user will witness the extinguishment of green LED 14 and the illumination of red LED 16, the latter being coupled to line 256 via line 268. With line 256 now at logic high, this value is conveyed to switch function 265 (VCR B) to cause an electrically closed state. The source "B" signals introduced at cable 25 may then pass freely to the VCR input at connector 24. As line 254 is now at logic low, this causes an electrically open status at switch function 258 (VCR A), thus blocking any flow of source "A" signals from connector 23 to connector 24. Thusly, the user may conveniently choose by remote control which signal source will be supplied to a VCR's input.

We turn now to the operation of the ABC switch and associated control logic, represented here in general at 68 and 80, respectively, corresponding to blocks 68 and 80 of FIG. 2. The TV source select flip-flop function 220 of FIG. 7 reappears here as a D flip-flop with the same numeration, the clock terminal of which is coupled with the CLOCK 1 condition carrying line identified again at 104. The Q output of flip-flop 220 is not used, while the $\overline{Q}$ output is seen coupled to line 222, as well as through feedback line 304 to the data, "D" terminal such that successive positive going pulses at line 104 will alternately result in a logic high or logic low level at line 222. When the $\overline{Q}$ output of flip-flop 220 is at logic high, this is imposed along line 222 to cause an electrically closed condition of switch function 226 (TV C). Thus, source "C" signals presented from the VCR output at connector 27 are directed to the input of the TV at connector 26. This may, in certain cases, represent a signal generated by the VCR itself as with a videotape. Generally speaking, however, this will be either source "A" or source "B", whichever has been last selected by the user for presentation to the VCR input. This illustrates the advantageous use made of the VCR's internal splitter function by the present invention, which dictates that this routing must be used whenever it is desired to provide the same signal source to both a TV and VCR. Returning to line 222, it can be seen that the logic high level present there is also directed by line 229 to one input of NOR gate 306. The resulting output of this gate as at line 232 is, of course, unconditionally logic low, and is presented to switch function 234 (TV B) thus causing it to assume an electrically open state. This effectively prevents source "B" signals at cable 25 from reaching the TV at connector 26. In the same way, the logic high at line 222 is also conveyed to NOR gate 308 via line 228, causing a logic low output at that gate also. This is directed by line 242 to cause an electrically open state at switch function 244 (TV A) as well, thus blocking the passage of source "A" signals from connector 23 to connector 26, the TV. Note that NOR gates 306 and 308 correspond to block 230 of FIG. 7 as well as block 80 of FIG. 2, both represented by the same numeration here.

Now consider that the user wishes to provide to the TV input that source (A or B) which is not currently selected as the VCR input source. Any appropriate button on a remote transmitter will be depressed for the shorter of the two prescribed intervals, for example 2 seconds, thus not altering the present VCR input source. This creates a positive going transition at line 104 which causes the logic high $\overline{Q}$ output of flip-flop 220 to toggle to a logic low condition. This level is imposed upon line 222 causing switch function 226 (TV C) to be electrically open, thus blocking the source "C" or VCR output signals at connector 27 from reaching the TV input at connector 26. The logic low level present at line 222 is also directed to one input of each NOR gate 306 and 308 at lines 229 and 228, respectively. This causes gates 306 and 308 to act, in effect, as inverters with respect to the remaining input terminal of each, as at lines 262 and 310. The remaining input of gate 306 is coupled, inter alia, via line 310 to the output of gate 308; while the remaining input of gate 308 is coupled via line 262 to the Q output of flip-flop function 252 at line 254. Thus configured, the logic level present at line 254 will be inverted by gate 308 at its line 242 output, and this output logic level will be once again inverted at the line 232 output of gate 306. Gate 308 insures, therefore, that the electrically open or closed status of switch function 244 (TV A) as controlled by the logic level at line 242 will be opposite the status of switch function 258 (VCR A) as controlled by line 254. In the same way, gate 306 insures that the status of switch function 234 (TV B) as controlled by line 232 will be opposite the status of switch function 244 (TV A). In this way, when switch function 258 (VCR A) is electrically closed and conveying source "A" signals from connector 23 to the VCR at connector 24, switch function 244 (TV A) is electrically open to prevent those same source "A" signals from reaching the TV at connector 26, while switch function 234 (TV B) is electrically closed and directing source "B" signals from cable 25 to the TV. Similarly, when switch function 258 (VCR A) is electrically open and blocking source "A" signals at connector 23 from the VCR input at connector 24, switch function 244 (TV A) is electrically closed and conveys these same source "A" signals to the TV at connector 26, while switch function 234 (TV B) is electrically open to prevent the source "B" signals at cable 25 from also reaching the TV. Thus, as is apparent from this description, the user may employ any remote transmitter at hand not only to select the VCR input source, but may also conveniently choose whether the signal source applied to the TV will be the same as that supplied to the VCR, or the opposite. This TV source selection will be visually indicated to the user by LEDs 15 and 17, the operation of which is described in the following discourse.

LEDs 15 and 17 are under the logic control of NOR gates 312 and 314 as well as inverter 322, all of which correspond to block 240 of FIG. 7, as represented by that same general numeration here. Gates 312 and 314 act to determine whether the signals input to the TV at connector 26 originate at source "A" or source "B", even though they may be presented to the TV input via source "C", which is the output of the VCR. Under the instant logic provided by gates 312 and 314, it will be shown that this is accomplished by monitoring the electrically open or closed status of three of the five switch functions, namely 234 (TV B), 244 (TV A), and 258 (VCR A), as reflected by the logic levels present at lines 232, 242, and 254, respectively. In this regard, there are two conditions under which the signals presented to the TV will originate at source "A". The first and more obvious of the two is when switch function 244 (TV A) is electrically closed. The corresponding logic high at line 242 is directed to one input of gate 312 by line 250. This unconditionally results in a logic low at the output of gate 312, which is directed via line 316 to one input of gate 314. As switch function 234 (TV B) must be electrically open at this time, this is reflected by a logic low at line 232 which is directed by line 238 to the other input of gate 314. As both inputs of gate 314 are now logic low, its output is logic high and thus allows for the illumination of green LED 15 via line 318, in the presence of a low true enabling signal at line 108 and resistor R22. This indicates the presence of source "A" signals at the TV's input, which may represent non-premium cable signals. The other condition under which this source "A" is directed to the TV is with an electrically closed status of both switch function 226 (TV C) and 258 (VCR A). The closed status of the latter is reflected as a logic high at line 254, and is conveyed by lines 262 and 264 to one input of gate 312. Thus, the output of this gate is unconditionally at logic low and is directed to one input of gate 314 via line 316. Again, switch function 234 (TV B) is of course electrically open with the accompanying logic low at line 232 being directed by line 238 to the other input of gate 314. As both inputs of gate 314 are logic low, its output is once again at logic high allowing for the illumination of LED 15 as described above. There are also two conditions under which the signals presented to the TV will originate at source "B", the more obvious one being when switch function 234 (TV B) is electrically closed. The corresponding logic high at line 232 then is directed by line 238 to one input of gate 314, thus dictating a logic low at its output. This level is directed by line 320 to the input of inverter 322, causing a logic high at the output thereof. This causes the illumination of red LED 17 via line 324, in the presence of a low true enabling signal at line 108 and resistor R22. This indicates the presence of source "B" signals at the TV input, which may represent the premium output of a converter box. The other condition where this source "B" is directed to the TV is when both switch functions 226 (TV C) and 265 (VCR B) are electrically closed. All other switch functions being electrically open at this time, that open status of functions 244 and 258 is reflected as a logic low at both lines 242 and 254, respectively. This low level at line 242 is conveyed by line 250 to one input of gate 312, while the low level at line 254 is directed via lines 262 and 264 to the other input of gate 312. Both inputs being low, the output of this gate is of course logic high, which is conveyed via line 316 to one input of gate 314, thus mandating a logic low output at that gate. This level is seen directed via line 320 to the input of inverter 322, once again resulting in a logic high output thereof and allowing for the illumination of red LED 17 as described above. Note that inverter 322 assures that LEDs 15 and 17 cannot be illuminated simultaneously. As thus described, in the presence of any remote control command, the user is provided a visual indication of the origin of the signals present at the TV input, even if presented indirectly via a VCR splitting function.

A tabulation showing the above logic in source selection and the performance of the TV source indication decoder function 240 is represented in the following Table 1.

TABLE I

| Logic Level | | | | | | |
|---|---|---|---|---|---|---|
| FF220 | FF 252 | | VCR | TV | VCR | TV |
| $\bar{Q}$ | Q | $\bar{Q}$ | Source | Source | LED | LED |
| 1 | 1 | 0 | Cable | VCR | G | G |
| 0 | 1 | 0 | Cable | Box | G | R |
| 1 | 0 | 1 | Box | VCR | R | R |
| 0 | 0 | 1 | Box | Cable | R | G |

It should be noted that the described RF diode switching networks are designed to provide adequate isolation between signal sources only up to about 100 MHz. Since a cable converter box only provides signals at 72 MHz and below, this isolation characteristic is quite sufficient for the application cited. For other applications, however, it may be required to provide adequate isolation up to as much as 1000 MHz. This may be accomplished by adding additional stages to the described diode networks, for example cascading two such networks within each switching function. Also note that various other RF semiconductors may be employed in place of the described diodes. Further, the switching functions need not even be formed of semiconductors at all, as electromechanical devices are available for this purpose as well, for example RF relay type RK1-L-3V by Matsushita Electric.

Since certain other changes also may be made in the above-described apparatus and method without departing from the scope of the invention herein, it is intended that all matter contained in the description thereof or shown in the accompanying drawings shall be interpreted as illustrative and not in a limiting sense.

I claim:

1. A remote control signal receiver for universally translating various remote control transmitters transmitting a code defining sequence of radiated spaced pulse signals, comprising:
   a receiver network responsive to any given one of said sequence of radiated spaced pulse signals to derive a corresponding treated substantially continuous signal; and
   a logic network responsive to the sustained presence of said treated pulse signal for at least a first predetermined interval of time to transition from an initial condition and derive a first switching output condition.

2. The remote control signal receiver of claim 1 in which said logic network is responsive to the sustained presence of said treated signal for at least a second predetermined interval of time to derive a second switching output condition.

3. The remote control signal receiver of claim 1 in which said first predetermined interval is at least about one-half second duration.

4. The remote control signal receiver of claim 2 in which said second predetermined interval is at least about one second in duration.

5. The remote control signal receiver of claim 1 including a circuit assembly providing a function enable signal only in the presence of said treated signal.

* * * * *